(12) United States Patent
Punzo

(10) Patent No.: US 9,759,792 B2
(45) Date of Patent: Sep. 12, 2017

(54) METHOD OF CORRECTING INHOMOGENEITY OF THE STATIC MAGNETIC FIELD GENERATED BY THE MAGNET OF A MRI MACHINE AND DEVICE FOR CARRYING OUT SUCH METHOD

(71) Applicant: Esaote S.p.A., Genoa (IT)

(72) Inventor: Vincenzo Punzo, San Giorgio a Cremano (IT)

(73) Assignee: ESAOTE S.P.A., Genoa (IT)

( * ) Notice: Subject to any disclaimer, the term of this patent is extended or adjusted under 35 U.S.C. 154(b) by 921 days.

(21) Appl. No.: 13/922,573

(22) Filed: Jun. 20, 2013

(65) Prior Publication Data
US 2014/0028311 A1    Jan. 30, 2014

(30) Foreign Application Priority Data

Jun. 22, 2012 (IT) .............................. GE2012A0059

(51) Int. Cl.
| | | |
|---|---|---|
| *G01V 3/00* | (2006.01) | |
| *G01R 33/3875* | (2006.01) | |
| *G01R 33/3873* | (2006.01) | |
| *G01R 33/38* | (2006.01) | |
| *G01R 33/383* | (2006.01) | |
| *G01R 33/385* | (2006.01) | |

(52) U.S. Cl.
CPC ..... *G01R 33/3875* (2013.01); *G01R 33/3808* (2013.01); *G01R 33/3873* (2013.01); *G01R 33/383* (2013.01); *G01R 33/385* (2013.01); *G01R 33/3806* (2013.01)

(58) Field of Classification Search
CPC .................................................. G01R 33/3808
USPC ......................................... 324/319, 320, 318
See application file for complete search history.

(56) References Cited

U.S. PATENT DOCUMENTS

| | | | |
|---|---|---|---|
| 5,337,001 A | 8/1994 | McDougall et al. | |
| 5,382,904 A | 1/1995 | Pissanetzky | |
| 5,677,630 A | 10/1997 | Laskaris et al. | |
| 5,959,454 A * | 9/1999 | Westphal ........... | G01R 33/3808 324/319 |
| 6,504,462 B1 * | 1/2003 | Datsikas ............ | G01R 33/3873 324/320 |

(Continued)

FOREIGN PATENT DOCUMENTS

WO   WO 91/17454 A1   8/1991

OTHER PUBLICATIONS

F Romeo et al., Magnet Field Profiling: Analysis and Correcting Coil Design, Magnetic Resonance in Medicine 1, Mar. 1984, pp. 44-65.

(Continued)

*Primary Examiner* — Louis Arana
(74) *Attorney, Agent, or Firm* — Buchanan Ingersoll & Rooney PC

(57) ABSTRACT

The present invention relates to a method of correcting inhomogeneity of the static magnetic field generated by the magnet of a Nuclear Magnetic Resonance imaging machine, wherein the magnet is flat and the magnetic field on one side of said magnet is corrected such that a volume is defined, which is bounded by a spherical cap surface, in which volume and along which surface the magnetic field is homogeneous, i.e. has field lines having equal parallel directions and equal intensities.

17 Claims, 11 Drawing Sheets

(56) References Cited

U.S. PATENT DOCUMENTS

| | | | |
|---|---|---|---|
| 6,534,984 B2* | 3/2003 | Westphal | G01R 33/383 324/309 |
| 7,492,158 B2* | 2/2009 | Punzo | G01R 33/3802 324/319 |
| 8,237,440 B2* | 8/2012 | Balcom | G01R 33/3808 324/318 |
| 2004/0036472 A1 | 2/2004 | Goto | |
| 2004/0251901 A1 | 12/2004 | Tsuda et al. | |
| 2012/0098539 A1 | 4/2012 | Sakellariou et al. | |

OTHER PUBLICATIONS

Yanli Zhang et al., New Development of Monohedral Magnet for MRI Using the Combination of Genetic Algorithm and FEM-NESM, IEEE Transactions on Magnetics, vol. 44, No. 6, Jun. 2008, pp. 1266-1269.

Search Report issued on Mar. 15, 2013 Application No. IT GE20120059.

Written Opinion issued on Mar. 15, 2013 Application No. IT GE20120059.

Feng Liu et al., A Hybrid Field-Harmonics Approach for Passive Shimming Design in MRI, IEEE Transactions on Applied Superconductivity, vol. 21, No. 2, Apr. 2011, pp. 60-67.

\* cited by examiner

METHOD OF CORRECTING INHOMOGENEITY OF THE STATIC MAGNETIC FIELD GENERATED BY THE MAGNET OF A MRI MACHINE AND DEVICE FOR CARRYING OUT SUCH METHOD

The present invention relates to a method of correcting inhomogeneity of the static magnetic field generated by the magnet of a Nuclear Magnetic Resonance imaging machine, known as shimming, which method has the steps of:

a) generating a polynomial that represents the magnetic field generated by the magnet and comprises a plurality of harmonic terms, each associated with a coefficient;

b) measuring the magnetic field and sampling it in a plurality of points, with a predetermined distribution in space;

c) determining the coefficients from the field sampling values;

d) comparing the measured coefficients with those that describe the field having the desired characteristics;

e) defining a grid for positioning the correction elements relative to the magnet structure and relating it to the field structure;

f) calculating the position and magnitude parameters of one or more correction elements to obtain the desired field characteristics.

A number of attempts have been made heretofore to implement Magnetic Resonance imaging machines having a completely open magnet structure, i.e. consisting of a single plate element, in view of avoiding any limitation in the access to the imaging volume by a patient, caused by a gantry generated between two opposed magnetic field generating elements.

These attempts have been hitherto unsuccessful because they were not inspired by a shimming method that provided magnetic field correction in a volume having a predetermined geometric shape.

For example, an unilateral, non-flat magnetic distribution has been suggested, with a totally external imaging region, such that a saddle point of the magnetic potential is produced in this region, for the field to be theoretically uniform in a very narrow space around such saddle point.

Nevertheless, these are non-flat magnets and there is no mathematical-physical instrument that might be used for field homogeneity improvement or controlled enlargement of the homogeneity region.

This is because the magnet is designed with a geometrically complex shape, namely intended to create a homogeneity region, that is fixed and cannot be controlled or changed.

An example of such magnet is disclosed in "New Development of Monohedral Magnet for MRI Using the Combination of Genetic Algorithm and FEM-NESM", Yanli Zhang et al. IEEE Transaction on Magnetics, Vol 44, NO. 6, June 2008.

The invention has the object of overcoming these limitations of prior art Magnetic Resonance Imaging machines, by providing a method of correcting inhomogeneity of the magnetic field as described hereinbefore, wherein said magnet is also flat and said polynomial is a solution of the Laplace's equation with boundary conditions on a spherical cap, such that the magnetic field on one side of said magnet is corrected in a volume bounded by a spherical cap surface, in which volume and along which surface the magnetic field is homogeneous, i.e. has field lines having equal parallel directions and equal intensities.

This can be achieved by using appropriate mathematical arrangements to develop a solution to Laplace's equation with boundary conditions given on a spherical cap.

From a geometrical point of view, the term "flat magnet" is intended to designate a magnet consisting of a planar magnetic material distribution, with no holes, and having no symmetric magnetic material distribution in a further region of space, i.e. a fully open, asymmetric and single-sided magnet.

From a magnetic point of view, the term "flat magnet" is intended to designate a magnet consisting of a magnetic distribution that generates a flat potential profile, i.e. planar equipotential lines.

The magnet ay preferably be a permanent magnet, although it can also be an electromagnet, namely a superconducting electromagnet. The invention provides the important benefit of allowing the provision of an "open" or highly asymmetric magnet design, because magnetic field homogeneity may be achieved in a volume bounded by a spherical cap using, for example, a single ferromagnetic pole piece and a magnetic material distribution over a single region of space.

This will afford easy access to the imaging volume by the patient and will allow application of this general principle to dedicated machines, i.e. imaging magnets for the breast and/or the head and/or the limbs.

Such magnet structure design, with the above mentioned method of correcting magnetic field inhomogeneity on a spherical cap will also minimize energy losses occurring in magnets that do not have opposed pole pieces.

In a flat magnet, there is no way of obtaining a homogeneous field on a sphere, and hence on a part of a sphere, i.e. a cap, using the conventional spherical algorithm.

Conversely, the algorithm for magnetic field homogenization on a cap of the present invention provides a homogeneous field on a cap, in flat magnets.

The grid for positioning correction elements as defined hereinbefore is intended to be formed on a ferromagnetic plate, commonly known as pole piece, which is placed orthogonal to the main field direction.

Therefore, the grid is placed on the magnet, the term magnet being generally intended not only as the macroscopic distribution for generating the main magnetic field, but also as any other ferromagnetic part that forms the system and hence also the pole piece.

The magnitude parameters of the correction elements as defined above include the geometric dimensions of the element and the magnetic properties of the material that forms the element.

For permanent magnets, the correction elements consist of blocks of magnetized material for the so-called passive shimming.

Concerning the determination of position and magnitude parameters of one or more correction elements for obtaining the desired field characteristics, suggestions are found in the art to determine the theoretical equations that define the magnetic field generated in one point in space by a magnetic dipole located in one point of a positioning grid placed on a ferromagnetic pole piece having an infinite magnetic permeability.

One example of these calculations may be found, for instance, in Romeo F., Hoult Dl., "Magnet field profiling: analysis and correcting coil design", Romeo F., Hoult Dl., Magn Reson Med. 1984 March; 1(1):44-65.

Using these equations to determine the field on the spherical cap sampling grid, a spherical cap harmonic expansion may be extracted, by applying the algorithm.

Therefore, if a single correction element is defined, then all the expansions of the field generated at the points of the sampling grid may be calculated, by moving the single element from time to time over the positioning grid.

The expansions so created may be mathematically grouped into a so-called "effect matrix".

Using this effect matrix, appropriate mathematical minimization and/or optimization algorithms, such as pseudo-inversion, quadratic programming, Tikhonov regularization or else may allow determination of the best distribution of correction elements, in terms of their position on the positioning grid and magnitude parameters, to minimize or even eliminate field inhomogeneity.

For the Laplace's equation of the magnetic field to be solved on a spherical cap, an orthogonal basis of even functions and an orthogonal basis of odd functions are generated, either basis being alternately usable for spherical harmonics expansion to generate said polynomial.

In accordance with an exemplary embodiment, the step a) includes the steps of:

aa) identifying the following solution of the Laplace's equation of the magnetic field on a spherical cap:

$$B_l^m(r, \vartheta, \phi) = \left(\frac{r}{r_0}\right)^l P_l^m(\cos\vartheta)(a_l^m \cos\varphi + b_l^m \sin\varphi); \quad (1)$$

ab) computing the values of $$l_k = l_k(m, \vartheta_0) \text{ with } k \le m \in N \text{ and } 0 \le \vartheta_0 < \pi \quad (2)$$

to a desired order $m = M_{MAX}$ such that the functions $B_l^m$ form at least one basis of orthogonal functions on the spherical cap;

ac) generating said polynomial that represents the magnetic field generated by the magnet by expansion into series of normalized spherical cap harmonics.

Due to the superposition principle, the equation (1) becomes $$B(r, \vartheta, \phi) = \sum_{l=0}^{L_{MAX}} \sum_{m=0}^{l} \left(\frac{r}{r_0}\right)^l P_l^m(\cos\vartheta)(a_l^m \cos\varphi + b_l^m \sin\varphi). \quad (3)$$

With the shimming method, predetermined coefficients are minimized or eliminated for the magnetic field to become uniform within the reference surface.

In Equations (1) and (3), $P_l^m(\cos\vartheta)$ are the associated Legendre functions of the first kind, the numbers l and m are known as the order and degree of the harmonic, whereas the coefficients $a_l^m$ and $b_l^m$ indicate the magnitude of the harmonic of the reference sphere of radius $r_0$.

Like in all eigenvalue problems, the parameters $m^2$ and $l(l+1)$ are determined by the boundary conditions and must be defined such that the functions $B_l^m$ form a basis in ($\vartheta, \phi$) and can also be integrated and differentiated on the reference surface, such as a sphere or a spherical cap, but also an oblate, prolate surface or the like.

Therefore, generally and depending on the preset boundary conditions, l and m may either be integers or not.

The continuity conditions of $\phi$:

$$B_l^m(r, \vartheta, \varphi) = B_l^m(r, \vartheta, \varphi + 2\pi) \quad (4)$$

$$\frac{\partial B_l^m(r, \vartheta, \varphi)}{\partial \varphi} = \frac{\partial B_l^m(r, \vartheta, \varphi + 2\pi)}{\partial \varphi} \quad (5)$$

require m to be real and integer, which will apply irrespective of the preset boundary conditions.

If the continuity condition for $\vartheta$ is imposed at the points $\vartheta = 0$ e $\vartheta = \pi$:

$$B_l^m(r, 0, \varphi) = 0 \quad (6)$$
$$B_l^m(r, \pi, \varphi) = 0 \text{ with } m \ne 0$$

$$\frac{\partial B_l^m(r, 0, \varphi)}{\partial \vartheta} = \frac{\partial B_l^m(r, 0, \varphi)}{\partial \vartheta} \quad (7)$$
$$\frac{\partial B_l^m(r, \pi, \varphi)}{\partial \vartheta} = \frac{\partial B_l^m(r, \pi, \varphi)}{\partial \vartheta} \text{ with } m = 0$$

then l must also be an integer and the associated Legendre functions $P_l^m(\cos\vartheta)$ are converted into the known Legendre polynomials.

However, if the continuity condition is given on $\vartheta = \vartheta_0 \ne \pi$, where $\vartheta_0$ is the angular aperture of the cap, then this condition is no longer valid, which means that the parameter l may be a rational number, i.e. a non-integer number.

This parameter may be written as a function of m and $\vartheta_0$, as shown in Equation (2).

Therefore, the construction of an orthogonal basis on the spherical cap having an angular aperture $\vartheta_0$ requires the l values to be calculated to a desired order $m = M_{MAX}$.

According to a further exemplary embodiment, the step ab), i.e. computing the values of $l_k = l_k(m, \vartheta_0)$, comprises computing the zeros of Legendre functions $P_l^m(\cos\vartheta)$ and the derivatives of Legendre functions $$\frac{dP_l^m(\cos\vartheta)}{d\vartheta}$$

at $\vartheta$ by generating two bases of orthogonal functions, which are nonorthogonal to each other, which bases may originate two independent expansions to represent the magnetic field on the spherical cap surface (2).

Particularly, the step ab) includes the steps of:

aba) providing a general formulation of $$P_l^m(\cos\vartheta)$$

into $$P_l^m(t) = \quad (8)$$
$$\frac{1}{2^m m!} \frac{\Gamma(l+m+1)}{\Gamma(l-m+1)} (1-t^2)^{m/2} F\left(m-l, m+l+1; m+1; \frac{1-t}{2}\right),$$

where $$t = \cos\vartheta \text{ with } -1 < t \le 1 \quad (9)$$

$$\Gamma(z) = \int_0^\infty e^{-t} t^{z-1} dt \quad (10)$$

and $$F(a, b; c; z) = \sum_{k=0}^{\infty} \frac{(a)_k (b)_k}{k!(c)_k} z^k \quad (11)$$

with $|z|<1$ and $(a)_k$, $(b)_k$ and $(c)_k$ being shifted factorials;
abb) computing the zeros of $$P_l^m(t_0) = 0 \qquad (12)$$

and $$\frac{dP_l^m(t_0)}{dt} = 0 \qquad (13)$$

resulting in the following conditions to be separately fulfilled $$\begin{cases} F(l, m, t_o) = 0 \\ lt_0 F(l, m, t_o) - (l-m)F(l-1, m, t_o) = 0 \\ t_0 \neq -1 \end{cases} \qquad (14)$$

and wherein the condition $F(l,m,t_0)=0$ generates an orthogonal basis of odd functions and the condition $lt_0F(l,m,t_0)-(l-m)F(l-1,m,t_0)=0$ generates an orthogonal basis of even functions.

In order to compute the zeros of the associated Legendre functions, the latter shall be rewritten as a hypergeometric function F (11) and the function Γ (10).

The term shifted factorials $(a)_k$, $(b)_k$ and $(c)_k$ is intended as $(a)_0=1 \ldots (a)_n=a(a+1) \ldots (a+n-1)$ with $n=1, 2, 3 \ldots$.

For completeness, note that if l is a non-negative integer, then:

$$\Gamma(l+m+1)=(l+m)! \qquad (15)$$

and $$\Gamma(l-m+1)=(l-m)! \qquad (16)$$

with $$F\left(m-l, m+l+1; m+1; \frac{1-t}{2}\right)$$

that becomes a polynomial of order (l–m), in other words, the well-known Legendre polynomials are obtained.

The zeros of the associated Legendre function $l_k=l_k(m, \vartheta_0)$ correspond to the eigenvalues of the solution of a problem with Sturm-Liouville boundary conditions.

Without going into detail, it can be demonstrated that these zeroes are obtained by separately solving these two equations (12) and (13).

Considering the above definition of the associated Legendre functions as hypergeometric functions, the equations (12) and (13) become the conditions (14) to be separately fulfilled, where the simplified notation for hypergeometric functions was used:

$$F(l, m, t) = F\left(m-l, m+l+1; m+1; \frac{1-t}{2}\right) \qquad (17)$$

The Equation $F(l,m,t_0)=0$ corresponds to the cases in which the eigenvalue problem is solved by imposing boundary conditions to the field values B (Dirichlet conditions) whereas the Equation $lt_0F(l,m,t_0)-(l-m)F(l-1,m,t_0)=0$ corresponds to the cases in which the eigenvalue problem is solved by imposing boundary conditions to the derivative of B (Neumann conditions).

Since the two equations cannot be simultaneously fulfilled for $t_0 \neq -1$ then two classes of orthogonal functions, i.e. two orthogonal bases of functions, will be generated, where, as is usual, the term orthogonal means that the following relation shall apply:

$$\int_{t_0}^{1} P_l^m(t) P_{l'}^m(t) dt = \delta_{l,l'} \qquad (18)$$

Therefore, these functions are orthogonal within their own set, and not to each other.

The above clearly shows the difference between the spherical harmonics method and the spherical cap harmonics method.

Without going into detail, it can be demonstrated that the Legendre functions with indices $l_k$ obtained from the first equation are odd functions in t whereas the second are even functions in t.

This implies that the magnetic field may be reconstructed on the spherical cap by only considering a superposition, i.e. an expansion of even or odd harmonics.

Therefore, for the Laplace's equation of the magnetic field to be solved on a spherical cap, an orthogonal basis of even functions and an orthogonal basis of odd functions are generated, either basis being alternately usable for spherical harmonics expansion to generate said polynomial.

Thus, unlike the case of the well-known standard solution of the Laplace's equation with spherical harmonics and boundary conditions given on an entire sphere, the magnetic field may be reconstructed on a spherical cap, considering an expansion of even or odd functions only.

In accordance with an improvement, the step ac) includes the steps of:

aca) defining the normalized spherical cap harmonic (l,m) as:

$$\begin{pmatrix} \overline{R}_l^m(\vartheta, \varphi) \\ \overline{S}_l^m(\vartheta, \varphi) \end{pmatrix} = \overline{P}_l^m(\cos\vartheta) \begin{pmatrix} \cos(m\varphi) \\ \sin(m\varphi) \end{pmatrix} \qquad (19)$$

wherein $\overline{P}_l^m(\cos \vartheta)$ are said even functions or said odd functions and wherein normalization results in:

$$\frac{1}{2\pi(1-\cos\vartheta_0)} \int\int_{Cap} (\overline{R}_l^m)^2 d\sigma = \frac{1}{2\pi(1-\cos\vartheta_0)} \int\int_{Cap} (\overline{S}_l^m)^2 d\sigma = 1 \qquad (20)$$

acb) generating said polynomial that represents the magnetic field generated by the magnet as an expansion into a series of spherical cap harmonics in the following form:

$$B(r, \vartheta, \varphi) = \sum_{n=0}^{N_{max}} \sum_{m=0}^{n} \left(\frac{r}{r_0}\right)^{l_n(m)} [a_{l_n}^m \overline{R}_{l_n}^m(\vartheta, \varphi) + b_{l_n}^m \overline{S}_{l_n}^m(\vartheta, \varphi)] \qquad (21)$$

The term $2\pi(1-\cos \vartheta_0)$ of Equation (19) is the area of the relevant spherical cap.

In the particular case of $\vartheta_0=90°$, i.e. in the case of a hemisphere, the values $$l_k = l_k\left(m, \frac{\pi}{2}\right)$$

are again integers and the associated Legendre functions become Legendre polynomials.

In yet another exemplary embodiment, the coefficients of said expansion according to the equation:

$$\begin{pmatrix} a_{l_n}^m \\ b_{l_n}^m \end{pmatrix} = \frac{1}{2\pi(1-\cos\vartheta_0)} \iint_{Cap} B(r_0, \vartheta, \varphi) \begin{pmatrix} \overline{R}_{l_n}^m(\vartheta, \varphi) \\ \overline{S}_{l_n}^m(\vartheta, \varphi) \end{pmatrix} d\sigma \quad (22)$$

are calculated with the Gauss quadrature method:

$$\int_a^b f(x)dx \cong \sum_{i=1}^{N_{max}} w_i f(x_i), \quad (23)$$

Gauss abscissas $x_i$ being used to determine a sampling grid comprising said plurality of points and depending on the selected orthogonal basis of functions.

Therefore, the coefficients $a_{l_n}^m$ and $b_{l_n}^m$ may be found, exactly like in the spherical harmonics formalism, using Equation (22).

In Equation (23) the terms $x_i$ and the terms $w_i$ are known as abscissas and Gauss weights respectively and depend on the integrand function, whereas the maximum order $N_{max}$ regulates the precision of the numerical calculation and is associated with the maximum order $l_{N_{max}}$ of the expansion to be determined.

In one embodiment, Gauss abscissas, translated into Cartesian coordinates, define the grid of sampling points of the magnetic field, i.e. the best choice shall measure the field for proper approximation of the expansion coefficients.

Particularly, the step b) comprises measuring the magnetic field in a first sampling grid, if said expansion is generated by the orthogonal basis of odd functions, or measuring the derivative of the magnetic field at $\vartheta$ in a second sampling grid, if said expansion is generated by the orthogonal basis of even functions.

In the case of spherical cap harmonics, a considerable distinction is found in field sampling.

If odd harmonics are used, the boundary conditions to be considered are those on the field B (Dirichlet conditions), but if the faminly of even functions is used, then the boundary conditions to be used are those on the derivatives of B (i.e.

$$\frac{\partial B}{\partial \vartheta},$$

Neumann conditions).

Therefore, the field sampling grids obtained in both cases are different and will be later numerically processed in different manners.

In a preferred embodiment, the expansion with odd spherical cap harmonics is used, which requires measurement of the field B and is totally similar to the methods already validated for spherical, oblate-spheroidal and ellipsoidal harmonics.

This choice is also dictated by the fact that the imposition of Neumann conditions clearly requires at least twice the sampling points for numerical and experimental determination of the derivative B. In a further exemplary embodiment, said spherical harmonics, which belong to eight families of symmetries in the case of a solution of the Laplace's equation with boundary conditions on a sphere, belong to four families of symmetries in the case of a spherical cap, the eight symmetries of the spherical arrangement being equivalent in pairs, i.e. each pair of symmetries being generated by an identical distribution of correction elements.

Thus, the desired field characteristics may be simply obtained by minimizing the coefficients of four symmetries.

Therefore, in the spherical algorithm, the solution of the Laplace's equation may be represented as a linear superposition of functions belonging to eight different spatial symmetries.

Conversely, in the spherical cap algorithm, the solution of the Laplace's equation may be represented as a superposition of functions or harmonics belonging to 4 different spatial symmetries.

For correction of eight symmetries in the spherical case, eight different positioning patterns of the correction elements are required.

In the case of the present invention, in which a single flat pole piece is provided, four different positioning patterns of the correction elements are only required, which means that in the spherical case the four additional symmetries are out of control, and cannot be corrected.

In the spherical cap case of the present invention, since the solution of the Laplace's equation is represented by the superposition of functions belonging to four symmetries, the four different positioning patterns of the correction elements may correct each of the four symmetries.

The eight symmetries are PPC, DPC, PDC, DDC, PDS, DDS, PPS, DPS, where the first letter indicates the index l, the second the index m and the third the $\phi$ dependence of the harmonic function in $\phi$, where P means even, D means odd, C means cosine and S means sine.

The spherical symmetry PPC is clearly found to be projected on the spherical cap symmetry DPC, the spherical symmetry PDC is projected on the spherical cap symmetry DDC, the spherical symmetry PDS is projected on the spherical cap symmetry DDS and the spherical symmetry PPS is projected on the spherical cap symmetry DPS, in what can be defined as "collapse of symmetries by coupling".

Merging occurs between coefficients belonging to symmetries that are antisymmetric in the asymmetric direction of the magnet, i.e. the Y direction, that is the direction perpendicular to the surface of the magnet.

For instance, when merging of PPC and DPC is considered, PPC is found to be an even symmetry in the three Cartesian directions X, Y and Z, and this symmetry may be indicated as (+1, +1, +1), whereas DPC is an even symmetry in X and Z, and an odd symmetry in Y, i.e. (+1, −1, +1).

Therefore merging occurs between symmetries that are antisymmetric in Y, i.e. in the antisymmetric direction of the magnet.

The same rule is found in merging of PDC (+1, −1, −1) and DDC (+1, +1, −1), of PDS (−1, −1, +1) and DDS (−1, +1, +1) and of PPS (−1, +1, −1) and DPS (−1, −1, −1).

The above coupling of symmetries applies when Dirichlet boundary conditions are selected; if Neuman boundary conditions are selected, odd spherical symmetries will project on even spherical cap symmetries.

This mathematical result has an essential reflection on magnetic field shimming, as symmetry coupling is physically equivalent to the case in which a pair of symmetries is generated by an identical distribution of magnetic dipoles.

For instance, considering a dipole distribution with DPC symmetry, its twin symmetry PPC may be also corrected, and so on.

Therefore, magnetic field homogenization will simply require minimization of the coefficients of four symmetries, i.e. the odd symmetries in the above preferred embodiment.

This result, that fully reflects the imaging volume asymmetry in the Y direction, i.e. perpendicular to the surface of the magnet, is important in view of designing a dedicated magnet having a spherical cap as an imaging volume, as it allows the above magnet to have a single pole piece (single-pole flat magnets), resulting in clear and apparent application advantages.

The above clearly shoes that the algorithm for magnetic field homogenization on a cap provides a homogeneous field on a cap, in flat magnets.

This result is achieved because certain separated pairs of symmetries in the spherical arrangement merge in the spherical cap formulation.

In the spherical case, an unilateral distribution of correction elements that fulfill one of the symmetries, appropriately selected to achieve controlled correction, will cause uncontrolled modification of the associated symmetry.

Therefore magnetic field shimming may not be achieved, as control cannot be achieved on all the symmetries.

This problem totally disappears in the case of the spherical cap.

The numerical algorithm for the spherical cap is valid for any aperture teta<180°.

For teta=180° the algorithm is not applicable as it numerically generates infinites.

This is clearly caused by the fact that the passage to the mathematical and analytical limit, i.e. the determination of the limit of the spherical cap harmonics for teta->180° in an attempt to obtain spherical harmonics, is not numerically applicable.

The invention also relates to a Nuclear Magnetic Resonance Imaging device, comprising a magnet for generating a static magnetic field, means for generating magnetic field gradients, means for emitting excitation pulses, means for receiving the magnetic resonance signals emitted by the target body and means for correcting inhomogeneity of said static magnetic field, which inhomogeneity correcting means include one or more correction elements for obtaining the desired field characteristics and processing means for calculating the position and magnitude parameters of said one or more correction elements, wherein said magnet is flat and means are provided for correcting magnetic field inhomogeneity, such that the magnetic field on one side of said magnet is corrected in an imaging volume bounded by a spherical cap surface, in which volume and along which surface the magnetic field is homogeneous, i.e. has field lines having equal parallel directions and equal intensities.

In a preferred embodiment, said processing means at least partially implement the above described method.

In a variant embodiment, these means for generating gradients include fixedly mounted gradient coils, the gradient coils extending perpendicular to the surface of the magnet having tracks arranged on a flat wall parallel to the surface of the magnet and on two parallel vertical walls, which are in opposed and spaced relationship, and are joined along the corresponding peripheral edges of said flat wall parallel to the surface of the magnet, and the further gradient coils extending in two further directions parallel to the surface of the magnet being respectively arranged on two walls in opposed relationship, each overlapping said vertical walls, said coils being in such arrangement as to at least partially contain said imaging volume.

In a further variant embodiment, said means for generating gradients include gradient coils mounted in at least partially removable fashion, the gradient coils extending perpendicular to the surface of the magnet consisting of first and second sets of substantially circular concentric tracks, and the gradient coils extending in second and third directions parallel to the surface of the magnet consisting each of first and second sets of tracks, each set being composed of two subsets of substantially semicircular concentric tracks separated by a diametrical axis, the diametrical axis of the gradient coils extending in said second direction being oriented perpendicular to the diametrical axis of the gradient coils extending in said third direction, and said first sets being arranged in mutually overlapping relationship on the surface of said magnet and said second sets being arranged in mutually overlapping relationship on a wall opposed to the surface of the magnet of a support structure, such that said coils at least partially contain said imaging volume.

In a further improvement, said support structure comprises a receiving coil.

For the patient to be positioned in such a manner that an organ or a body part of interest is within the spherical cap, patient supporting means are provided, such as a bed or the like.

A further object of the present invention is a Nuclear Magnetic Resonance Imaging device, comprising a magnet for generating a static magnetic field, means for generating magnetic field gradients, means for emitting excitation pulses, means for receiving the magnetic resonance signals emitted by the target body and means for correcting inhomogeneity of said static magnetic field, which inhomogeneity correcting means include one or more correction elements for obtaining the desired field characteristics and processing means for calculating the position and magnitude parameters of said one or more correction elements, wherein said magnet comprises two pole pieces in spaced relationship on opposite sides of a patient receiving volume, means being provided for correcting the magnetic field in said receiving volume such that the magnetic field is corrected in an imaging volume, bounded by a spherical cap surface, in which volume and along which surface the magnetic field is homogeneous, i.e. has field lines having equal parallel directions and equal intensities.

In a preferred embodiment, said device is formed as described above and with the above mentioned characteristics.

These and other features and advantages of the present invention will appear more clearly from the following description of a few embodiments, illustrated in the annexed drawings, in which:

FIG. 1 shows a possible magnetic design for a Magnetic Resonance Imaging device, in which the magnetic field generating magnet 1 is a flat magnet.

The magnetic field on one side of said magnet is corrected by the above described method such that an imaging volume is defined, which is bounded by a spherical cap surface 2, in which volume and along which surface the magnetic field is homogeneous.

The spherical cap surface 2 may have any orientation.

The present invention also contemplates a magnet with two opposite pole pieces, not shown, with an imaging volume being defined between said pole pieces, which is bounded by the spherical cap surface 2, and shimming being carried out thereon.

Figure 1:
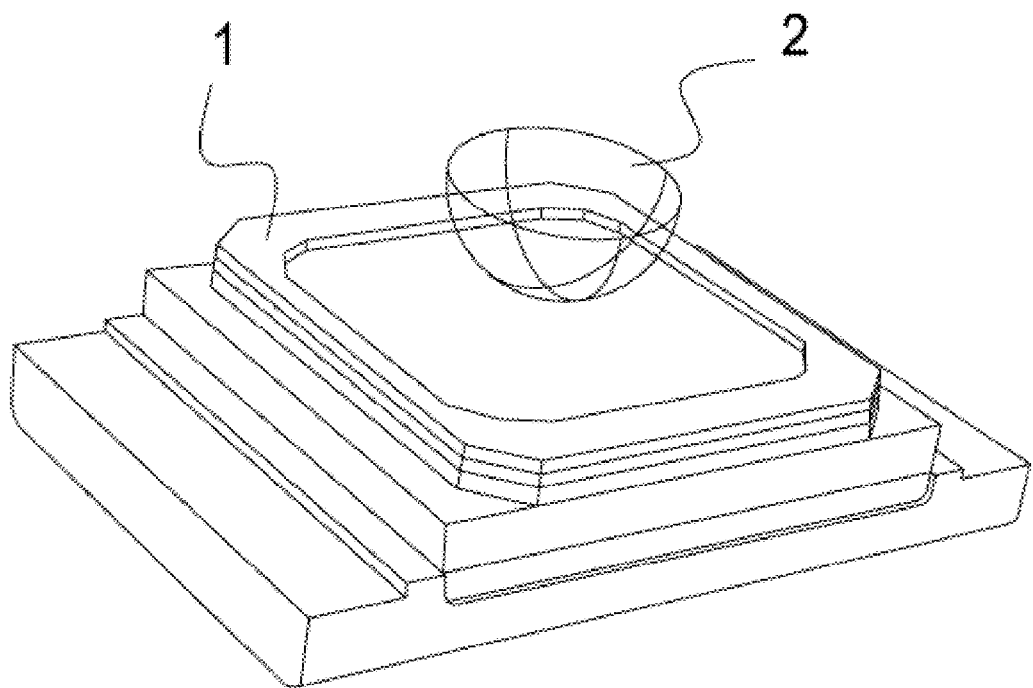
FIG. 1 shows an exemplary embodiment of the device of the present invention.
Figure 2:
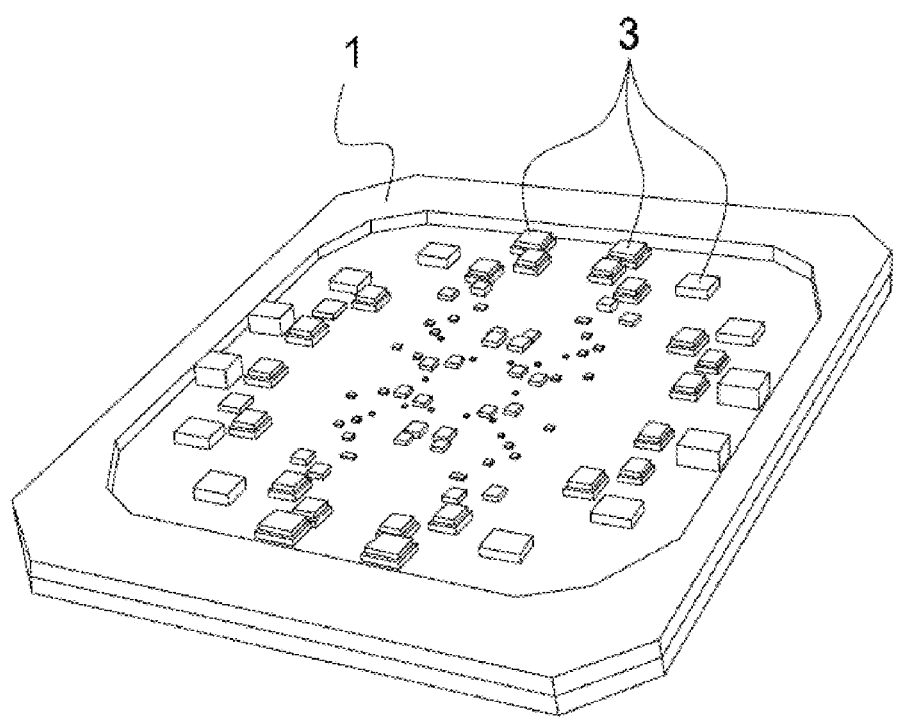
FIG. 2 shows an exemplary embodiment of the distribution of magnetic field correction elements.

FIG. 2 shows an example of the distribution of correction elements to obtain the desired field characteristics, particularly magnetic dipoles 3 in a shimming simulation.

It will be appreciated that a rather small number of magnetic dipoles 3 is sufficient for an effective shimming process on the spherical cap surface 2.

Figure 3:
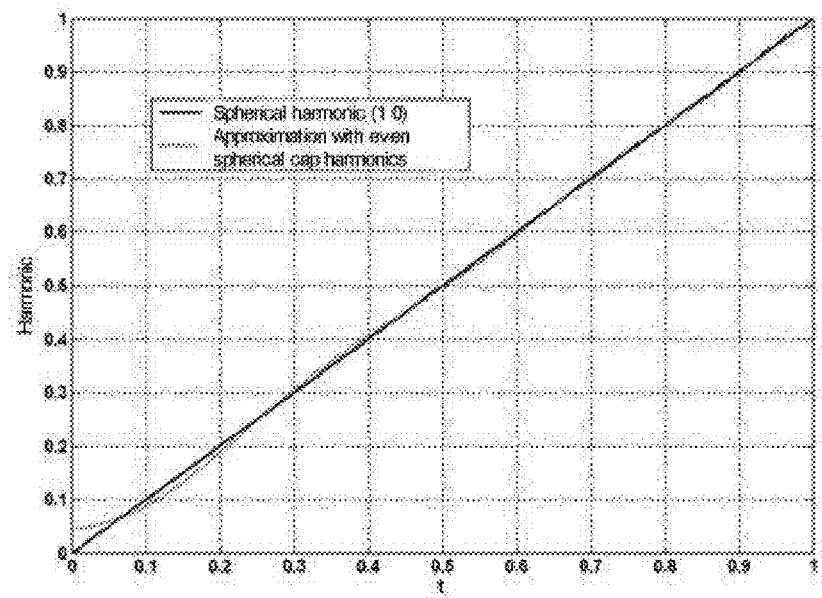
FIGS. 3 and 4 show a comparison between spherical harmonics and their decomposition into spherical cap harmonics.
Figure 4:
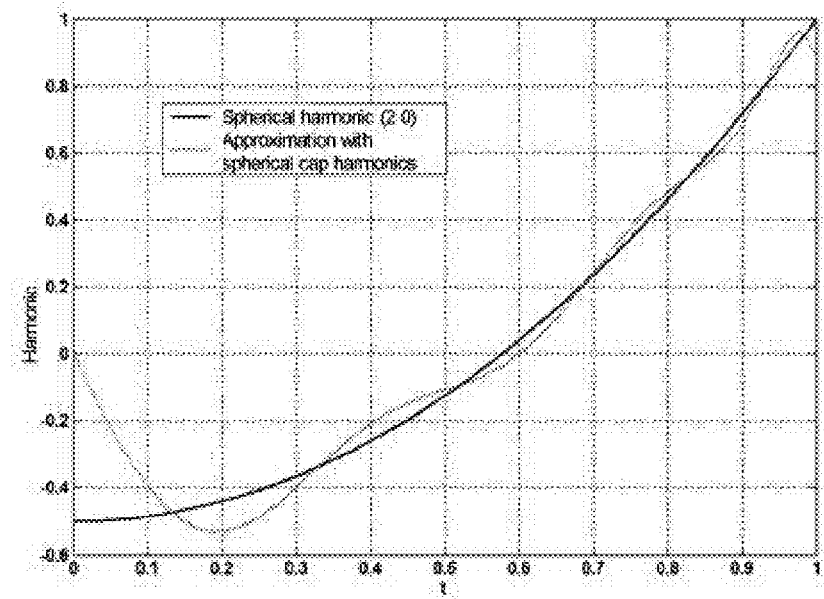

FIGS. 3 and 4 show two comparisons of spherical harmonics and their decomposition into spherical cap harmonics, to form the $l_{12}$ order summation, for the case of the hemisphere ($t_0=0$).

Particularly, FIG. 3 shows the spherical harmonic $P_{1,sphere}^{0}(t)$ and its decomposition into even spherical cap harmonics, and FIG. 4 shows the spherical harmonic $P_{2,sphere}^{0}(t)$ and its decomposition into odd spherical cap harmonics.

As shown in the diagram, the approximation of an odd spherical harmonic with even spherical cap harmonics is quite good over the entire range $0 \leq t \leq 1$ whereas wider oscillations are found in the case $P_{2,sphere}^{0}(t)$.

In both cases there is a larger deviations at values corresponding to points close to the edge of the cap. This behavior, that is found for all spherical harmonics, reflects the manner in which the families of spherical cap harmonics were constructed: they do not fulfill both continuity conditions (for instance, in the first case they do not fulfill the annulation condition in $t_0$).

This theoretical "error" affects the mathematical precision of the method, but this approximation is substantially negligible in both numerical and physical terms, and does not invalidate the applicability of the method.

Figure 5:
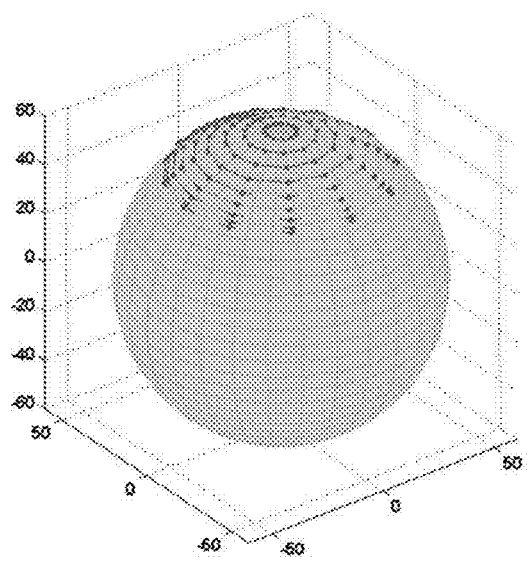
FIGS. 5 and 6 show two exemplary embodiments of the magnetic field sampling grid.
Figure 6:
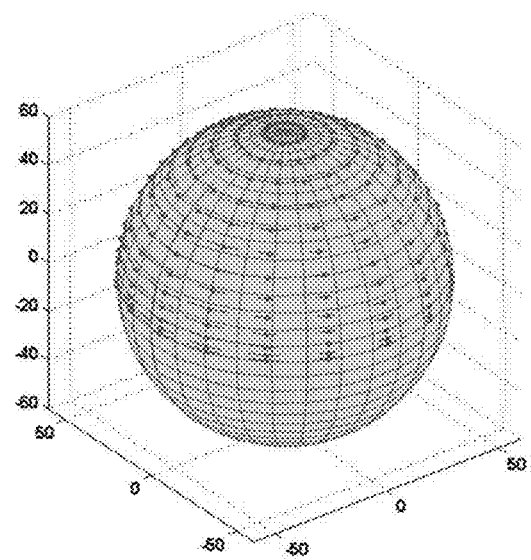

FIGS. 5 and 6 show two exemplary embodiments of the magnetic field sampling grid in the preferred embodiment in which odd harmonics are used, and the boundary conditions to be considered are Dirichlet conditions, i.e. on the value of the field B.

In FIG. 5 sampling is carried out for a cap of radius $r_0=60$ mm, aperture $\vartheta_0=45°$ and $N_{MAX}=8$, whereas in FIG. 6 sampling is carried out for a cap of radius $r_0=60$ mm, aperture $\vartheta_0=90°$ and $N_{MAX}=12$.

Figure 7:
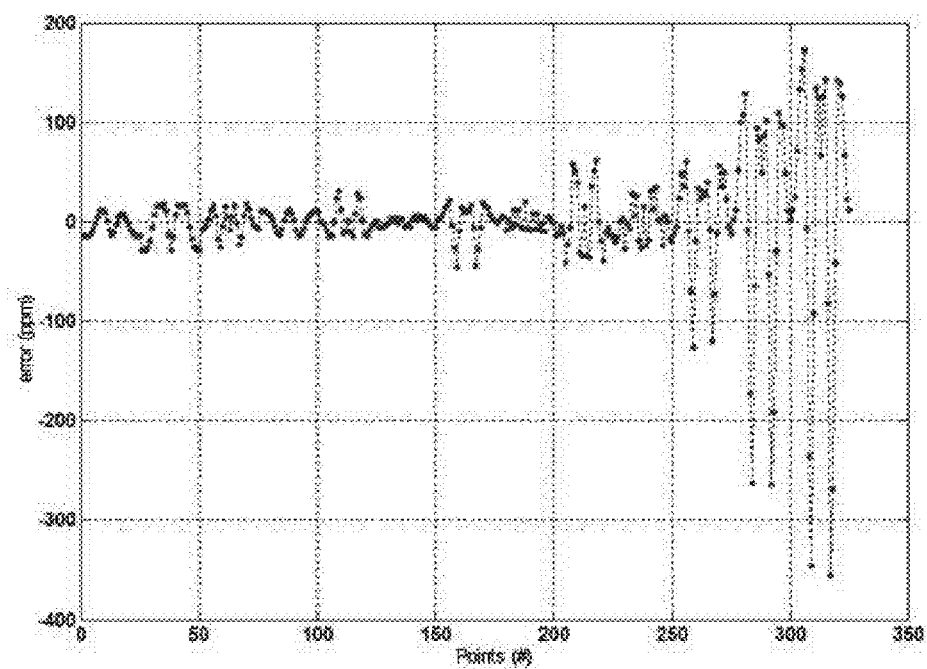
FIGS. 7 to 9 show the magnetic field error as calculated with respect to the field measured at different stages of the correction process.
Figure 8:
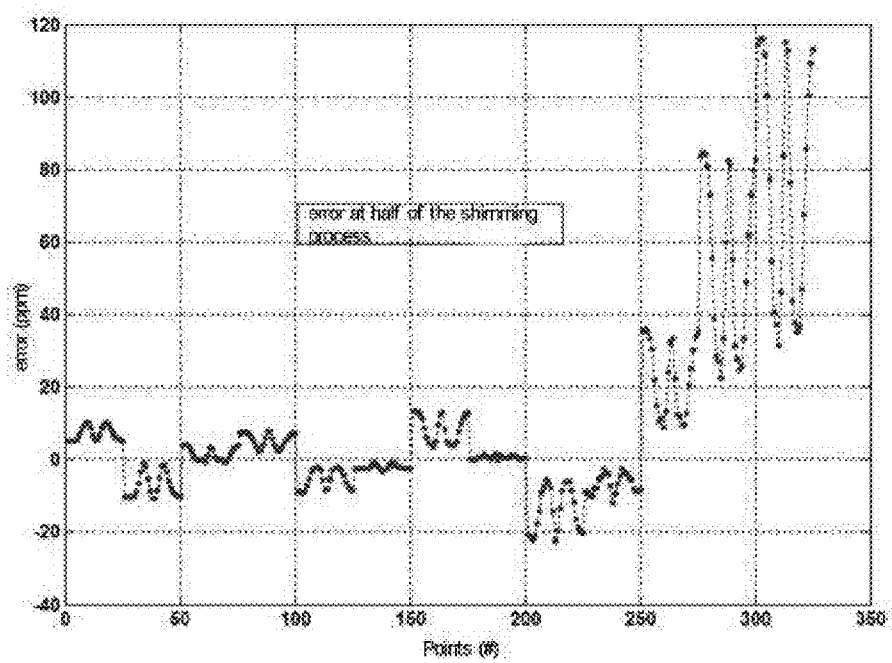
Figure 9:
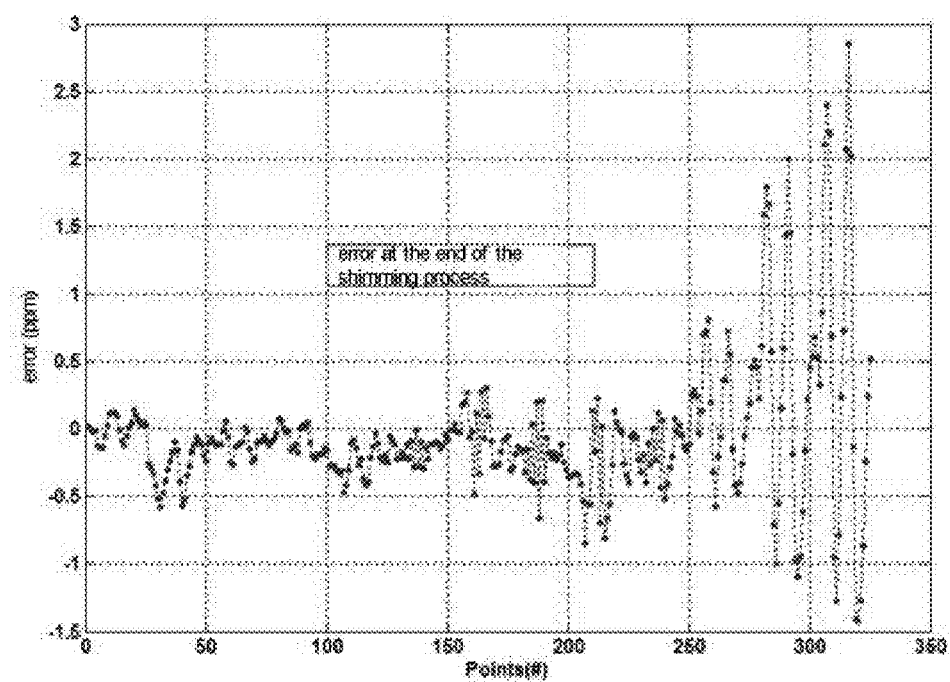

FIGS. 7 to 9 show the magnetic field error as calculated with respect to the field measured at different stages of the correction process.

The field was recalculated at the points of a spherical cap with parameters $r_0=60$ mm, $\vartheta_0=90°$, $N_{max}=12$, i.e. a hemisphere.

Correct expansion is typically assessed by recalculating the starting magnetic field at the sampling points, and determining the error (in ppm) of the reconstructed field at each point.

FIG. 7 shows the chart of what is observed considering an expansion at the start of the shimming process.

Here, the error resulting from recalculation of the field from spherical cap harmonics expansion is very low for almost the totality of sampling points, whereas it starts to be of some importance at the points close to the edge of the cap.

This error shall not be intended as purely numeric (it is actually independent of the maximum expansion order), but it substantially confirms what was previously stated about the error expected due to the method of constructing the spherical cap harmonics that form the basis of orthogonal functions.

On the other hand, FIGS. 8 and 9 show the error considering an expansion for a field measurement at half of a shimming process and at the end of the shimming process.

The diagrams show that as field homogeneity increases the error on the recalculated field at the points close to the cap edge considerably decreases.

This behavior is substantially identical to what is observed in the validated methods concerning spheres, oblates and ellipsoids, and indicates that the main error source derives from low-order harmonics, which are predominant at the start of the shimming process, and not from high-order harmonics, which are predominant at the end of the shimming process but are of lower amplitude.

The data of the figures show that the odd spherical cap harmonics expansion provides a correct representation of the magnetic field on the reference surface and that the resulting error is substantially negligible in the recursive field shimming method.

The device of the present invention also has gradient generating means comprising fixedly-mounted gradient coils, as shown in FIGS. 10 to 13, in such an arrangement as to at least partially contain said imaging volume.

Figure 11:
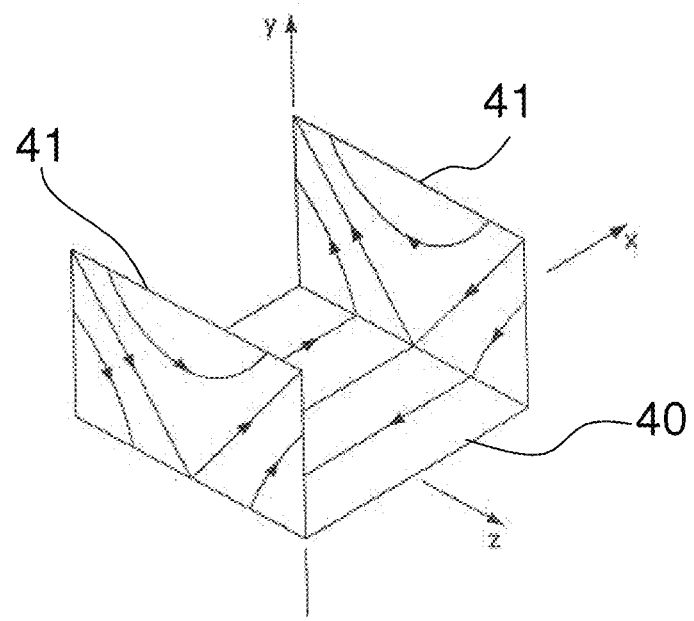

The gradient coils that extend in a first direction perpendicular to the surface of the magnet 1, i.e. the Y direction, are shown in detail in FIG. 11 ad have plates arranged on a flat wall 40 parallel to the surface of the magnet 1, and on two vertical walls 41, which are in opposed and spaced relationship, and are joined along the corresponding peripheral edges of said flat wall 40 parallel to the surface of the magnet 1.

Figure 10:
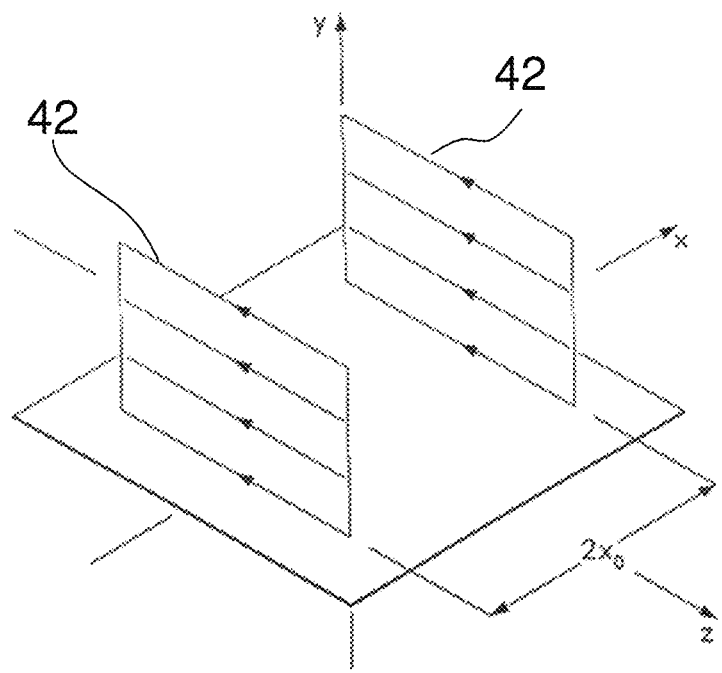
FIGS. 10 to 13 show an example of fixed gradient coils.
Figure 12:
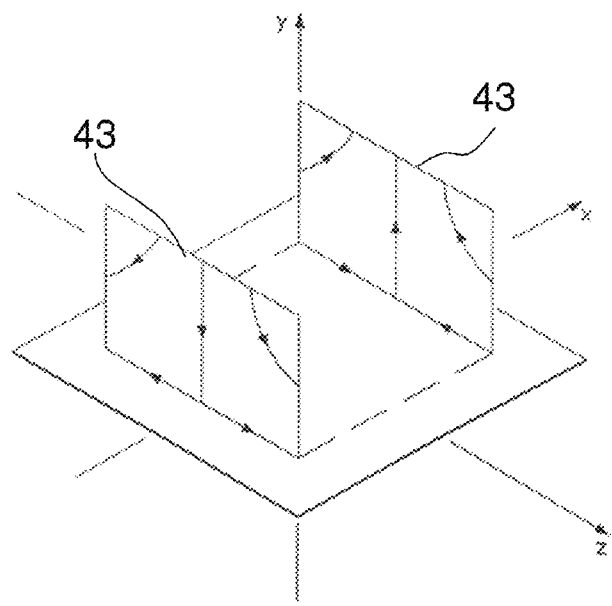

The further gradient coils extending in two further directions parallel to the surface of the magnet 1, particularly in the X and Z directions, are shown in FIG. 10 and FIG. 12 respectively.

The tracks of the gradient coils that extend in the X direction are arranged on two walls 42 perpendicular to the surface of the magnet 1 and in mutually opposed relationship, and the tracks of the gradient coils extending in the Z direction are arranged on two walls 43 perpendicular to the surface of the magnet and in mutually opposed relationship.

Figure 13:
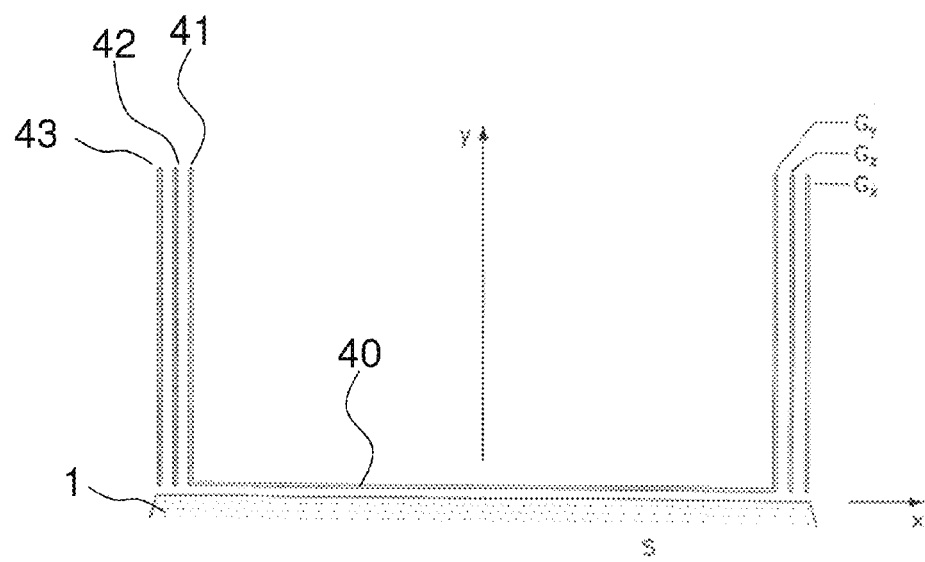

FIG. 13 shows a view of the fixed coils in a mounted state, in which the walls 42 of the gradient coils extending in the Z direction and the walls 43 of the gradient coils extending in the X direction are in mutually overlapped relationship outside the vertical walls 41 of the gradient coils extending in the Y direction.

FIGS. 14 to 17 show gradient coils mounted in at least partially removable fashion.

Figure 15:
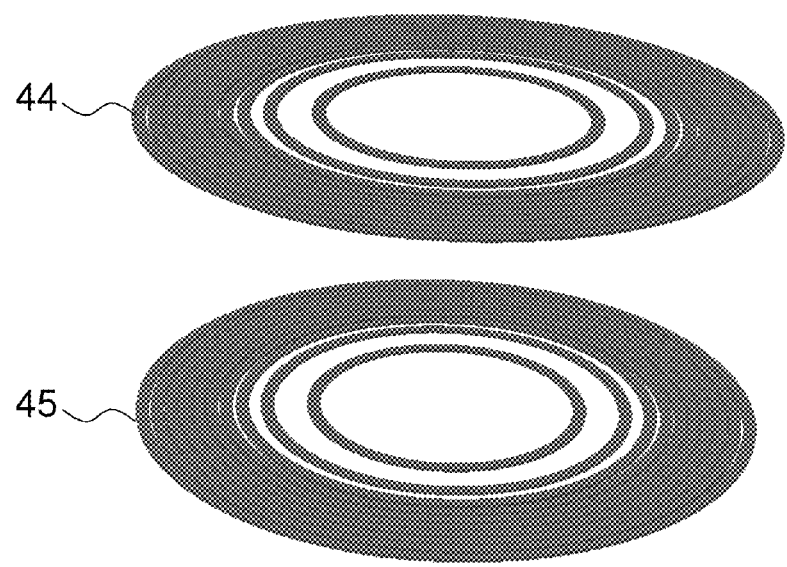

FIG. 15 show the gradient coils that extend perpendicular to the surface of the magnet 1, i.e. in the Y direction, and are composed of first and second sets 44 of substantially circular and concentric tracks.

Figure 14:
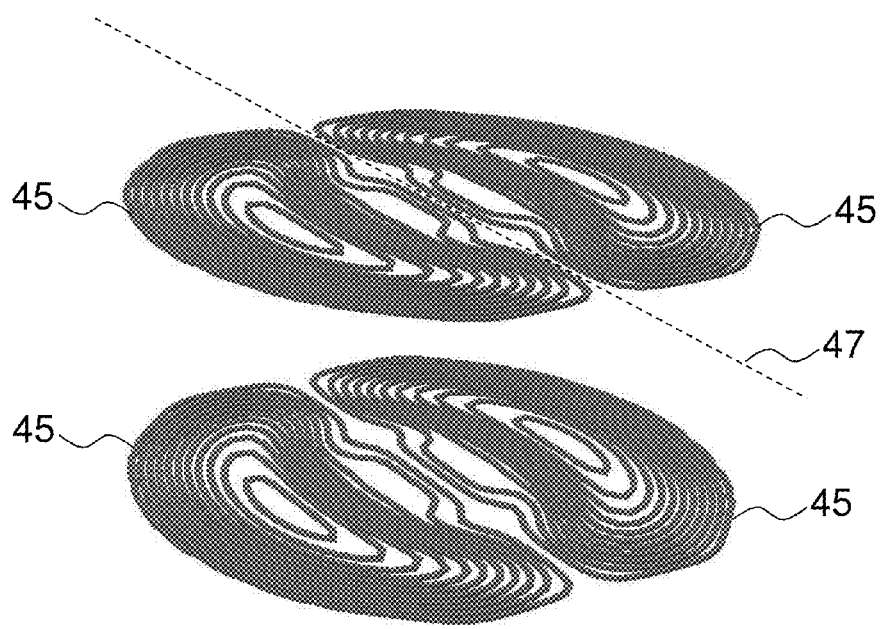
FIGS. 14 to 17 show an example of partially removable gradient coils.
Figure 16:
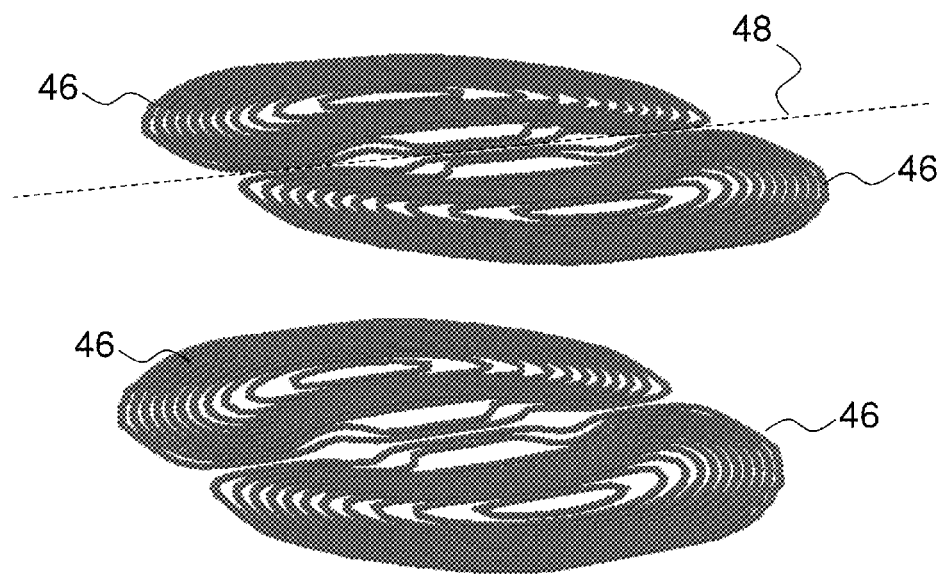
Figure 17:
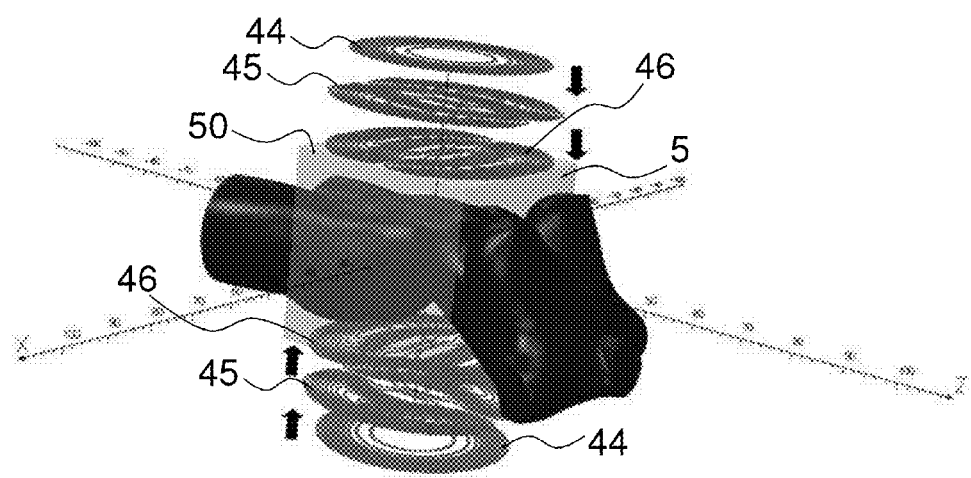
Figure 18:
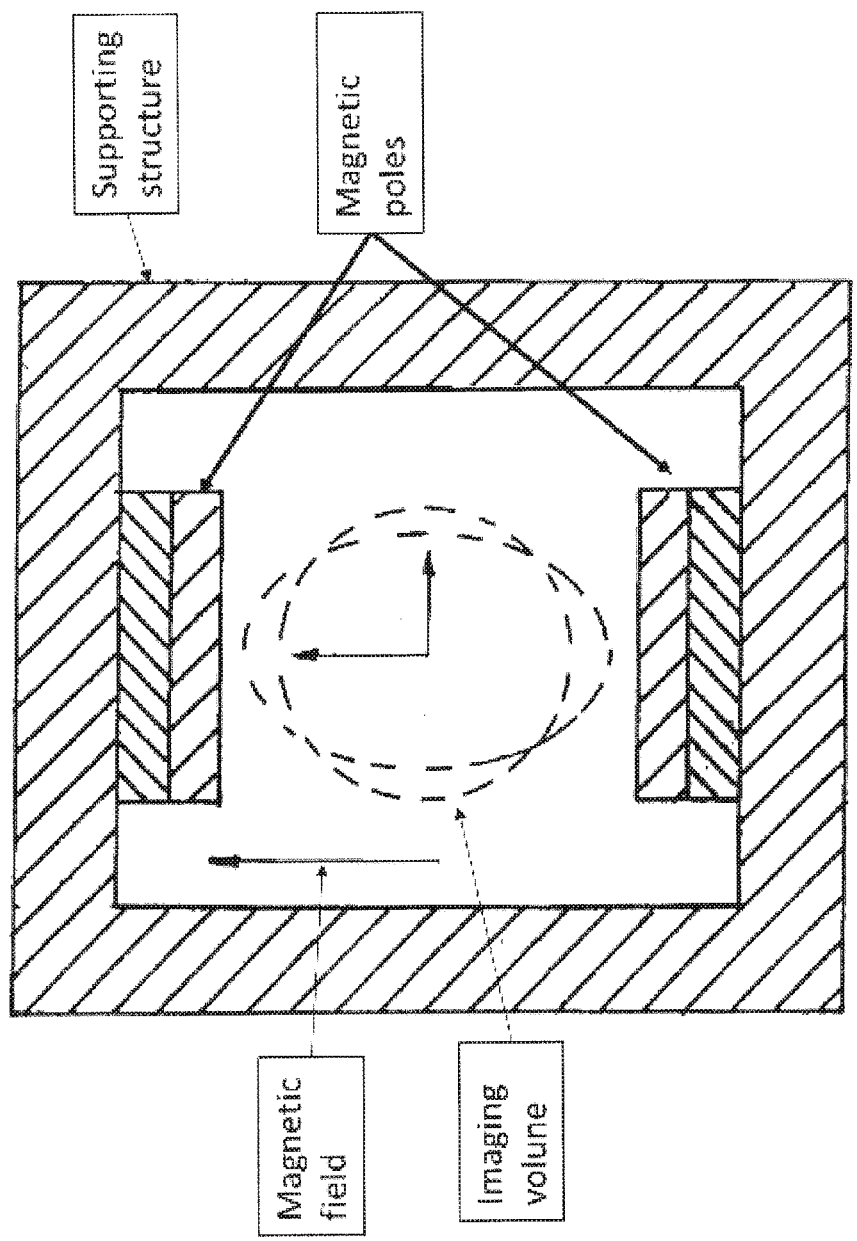
FIG. 18 shows a schematic diagram of a gantry and two pole pieces.

The gradient coils extending in second and third directions parallel to the surface of the magnet 1, particularly in the X and Z directions, are shown in FIG. 14 and FIG. 16 respectively.

The gradient coils that extend in the X direction are composed of first and second sets of tracks 45, each set being composed of two subsets of substantially semicircular and concentric tracks separated by a diametral axis 47, and the gradient coils that extend in the Z direction are composed of first and second sets of tracks 46, each set being composed of two subsets of substantially semicircular and concentric tracks separated by a diametral axis 48.

The diametral axis 47 of the gradient coils that extend in the X direction is oriented perpendicular to the diametral axis 48 of the gradient coils that extend in the Z direction.

The first sets are placed in mutually overlapped relationship on the surface of the magnet 1, and the second sets are placed in mutually overlapped relationship on a wall 50, opposite to the surface of the magnet 1, of a support structure 5, such that these coils at least partially contain the imaging volume.

Preferably, the support structure 5 comprises or consists of a receiving coil, particularly the first sets are integral with the magnet and the second sets are integral with the receiving coil.

The invention claimed is:

1. A method of correcting inhomogeneity of a static magnetic field generated by a magnet of a Nuclear Magnetic Resonance imaging machine, which method has the steps of:
   a) generating a polynomial that represents the magnetic field generated by the magnet and comprises a plurality of harmonic terms, each associated with a coefficient;
   b) measuring the magnetic field at a plurality of points, with a predetermined distribution in space;
   c) determining the coefficients from the measured values;
   d) comparing the coefficients from the measured values with those that describe the field having the desired characteristics;
   e) defining a grid for positioning a plurality of correction elements and relating it to the field structure;
   f) calculating the position and magnitude parameters of said correction elements to obtain the desired field characteristics;
   wherein
   said magnet is flat and said polynomial is a solution of the Laplace's equation with boundary conditions on a spherical cap, such that the magnetic field on one side of said magnet in a volume bounded by a spherical cap surface, in which volume and along which surface the magnetic field is homogeneous such that the magnetic field defines field lines having equal parallel directions and equal intensities.

2. A method as claimed in claim 1, wherein said spherical harmonics belong to eight families of symmetries, and the desired field characteristics are obtained by simply minimizing the coefficients of said four symmetries.

3. A method as claimed in claim 1, wherein, for said Laplace's equation of the magnetic field to be solved over a spherical cap, an orthogonal basis of even functions and an orthogonal basis of odd functions are generated, either basis being alternately usable for spherical harmonics expansion to generate said polynomial.

4. A method as claimed in claim 1, wherein the step a) comprises the steps of:
   aa) identifying the following solution of the Laplace's equation of the magnetic field on a spherical cap:

$$B_l^m(r, \vartheta, \phi) = \left(\frac{r}{r_0}\right)^l P_l^m(\cos\vartheta)(a_l^m \cos\varphi + b_l^m \sin\varphi);$$

ab) computing the values of $$l_k = l_k(m, \vartheta_0) \text{ with } k \leq m \in N \text{ and } 0 \leq \vartheta_0 < \pi$$

to a desired order $m = M_{MAX}$ such that the functions $B_l^m$ form at least one basis of orthogonal functions over the spherical cap;
   ac) generating said polynomial that represents the magnetic field generated by the magnet by expansion into series of normalized spherical cap harmonics;
   wherein:
   B is the magnetic field in polar coordinates, wherein r is a radius r, $\vartheta$ is a polar angle, and $\phi$ and $\Phi$ is an azimuthal angle;
   l and m are the order and degree of the harmonics;
   $r_0$ is a reference radius which is needed to avoid singularities when $r_0$ approaches 0;
   $a_l^m$ and $b_l^m$ are the coefficients defining a magnitude of the harmonics;
   $P_l^m(\cos \vartheta)$ are associated Legendre functions of the first kind.

5. A method as claimed in claim 4, wherein the step ab) comprises computing the zeros of Legendre functions $P_l^m(\cos \vartheta)$ and the derivatives of Legendre functions at $\vartheta$, $$\frac{dP_l^m(\cos\vartheta)}{d\vartheta}$$

by generating two bases of orthogonal functions, which are nonorthogonal to each other, which bases may originate two independent expansions to represent the magnetic field on the spherical cap surface.

6. A method as claimed in claim 5, wherein the step ab) comprises the steps of:
   aba) providing a general formulation of $$P_l^m(\cos \vartheta)$$

in $$P_l^m(t) = \frac{1}{2^m m!} \frac{\Gamma(l+m+1)}{\Gamma(l-m+1)}(1-t^2)^{m/2} F\left(m-l, m+l+1; m+1; \frac{1-t}{2}\right),$$

where $t = \cos\vartheta$ with $-1 < t \leq 1$, $$\Gamma(z) = \int_0^\infty e^{-t} t^{z-1} dt$$

and $$F(a, b; c; z) = \sum_{k=0}^{\infty} \frac{(a)_k (b)_k}{k!(c)_k} z^k$$

with $|z| < 1$ and $(a)_k$, $(b)_k$ and $(c)_k$ being shifted factorials;
   abb) computing the zeros of $$P_l^m(t_0) = 0$$

and

-continued $$\frac{dP_l^m(t_0)}{dt} = 0$$

resulting in the following conditions to be separately fulfilled $$\begin{cases} F(l, m, t_o) = 0 \\ lt_0 F(l, m, t_o) - (l-m)F(l-1, m, t_o) = 0 \\ t_0 \neq -1 \end{cases}$$

and wherein the condition $F(l,m,t_0)=0$ generates an orthogonal basis of odd functions and the condition $lt_0F(l,m,t_0)-(l-m)F(l-1,m,t_0)=0$ generates an orthogonal basis of even functions.

7. A method as claimed in claim 6, wherein the step ac) comprises the steps of:
   aca) defining the normalized spherical cap harmonic (l,m) as:

$$\begin{pmatrix} \overline{R}_l^m(\vartheta, \varphi) \\ \overline{S}_l^m(\vartheta, \varphi) \end{pmatrix} = \overline{P}_l^m(\cos\vartheta) \begin{pmatrix} \cos(m\varphi) \\ \sin(m\varphi) \end{pmatrix}$$

wherein $\overline{P}_l^m(\cos \vartheta)$ are said even functions or said odd functions and wherein normalization results in:

$$\frac{1}{2\pi(1-\cos\vartheta_0)} \int\int_{Cap} (\overline{R}_l^m)^2 d\sigma = \frac{1}{2\pi(1-\cos\vartheta_0)} \int\int_{Cap} (\overline{S}_l^m)^2 d\sigma = 1$$

acb) generating said polynomial that represents the magnetic field generated by the magnet as an expansion into a series of spherical cap harmonics in the following form:

$$B(r, \vartheta, \varphi) = \sum_{n=0}^{N_{max}} \sum_{m=0}^{n} \left(\frac{r}{r_0}\right)^{l_n(m)} [a_{l_n}^m \overline{R}_{l_n}^m(\vartheta, \varphi) + b_{l_n}^m \overline{S}_{l_n}^m(\vartheta, \varphi)]$$

wherein:
$\overline{R}_l^m(\vartheta,\phi)$ represents even spherical cap harmonics; and
$\overline{S}_l^m(\vartheta,\phi)$ represents odd spherical cap harmonics.

8. A method as claimed in claim 7, wherein the coefficients of said expansions are computed using the equation:

$$\begin{pmatrix} a_{l_n}^m \\ b_{l_n}^m \end{pmatrix} = \frac{1}{2\pi(1-\cos\vartheta_0)} \int\int_{Cap} B(r_0, \vartheta, \varphi) \begin{pmatrix} \overline{R}_{l_n}^m(\vartheta, \varphi) \\ \overline{S}_{l_n}^m(\vartheta, \varphi) \end{pmatrix} d\sigma$$

are calculated with the Gauss quadrature method:

$$\int_a^b f(x)dx \cong \sum_{i=1}^{N_{max}} w_i f(x_i),$$

Gauss abscissas $x_i$ being used to determine a sampling grid comprising said plurality of points and depending on the selected orthogonal basis of functions.

9. A method as claimed in claim 8, wherein the step b) comprises measuring the magnetic field in a first sampling grid, if said expansion is generated by the orthogonal set of odd functions, or measuring the derivative of the magnetic field at $\vartheta$ in a second sampling grid, if said expansion is generated by the orthogonal set of even functions.

10. A Nuclear Magnetic Resonance Imaging device, comprising a magnet for generating a static magnetic field, means for generating magnetic field gradients, means for emitting excitation pulses, means for receiving the magnetic resonance signals emitted by the target body and means for correcting inhomogeneity of said static magnetic field, which inhomogeneity correcting means include one or more correction elements for obtaining the desired field characteristics and processing means for calculating the position and magnitude parameters of said one or more correction elements,
   wherein
   said magnet is flat and means are provided for correcting magnetic field inhomogeneity, such that the magnetic field on one side of said magnet is corrected in an imaging volume bounded by a spherical cap surface, in which volume and along which surface the magnetic field is homogeneous such that the magnetic field has field lines having equal parallel directions and equal intensities.

11. A device as claimed in claim 10, wherein said processing means at least partially implement a method of correcting inhomogeneity of the static magnetic field generated by the magnet of a Nuclear Magnetic Resonance imaging machine, which method has the steps of:
   a) generating a polynomial that represents the magnetic field generated by the magnet and comprises a plurality of harmonic terms, each associated with a coefficient;
   b) measuring the magnetic field at a plurality of points, with a predetermined distribution in space;
   c) determining the coefficients from the field sampling values;
   d) comparing the measured coefficients with those that describe the field having the desired characteristics;
   e) defining a grid for positioning a plurality of correction elements and relating it to the field structure; and
   f) calculating the position and magnitude parameters of said correction elements to obtain the desired field characteristics;
   wherein said magnet is flat and said polynomial is a solution of the Laplace's equation with boundary conditions on a spherical cap, such that the magnetic field on one side of said magnet in a volume bounded by a spherical cap surface in which volume and along which surface the magnetic field is homogeneous such that the magnetic field defines field lines having equal parallel directions and equal intensities.

12. A device as claimed in claim 10, wherein said means for generating gradients include fixedly mounted gradient coils, gradient coils being provided which extend in a direction perpendicular to the surface of the magnet, and which have tracks arranged on a flat wall parallel to the surface of the magnet and on two parallel vertical walls, which are in opposed and spaced relationship, and are joined along the corresponding peripheral edges of said flat wall parallel to the flat surface of the magnet, on the side in which the magnetic field is corrected, and further gradient coils being provided, which extend in two further directions parallel to the surface of the magnet and are respectively arranged on two walls in opposed relationship, each overlapping said vertical walls, said coils being in such arrangement as to at least partially contain said imaging volume.

13. A device as claimed in claim 10, wherein said means for generating gradients include gradient coils mounted in at least partially removable fashion, the gradient coils extending perpendicular to the surface of the magnet consisting of first and second sets of substantially circular concentric tracks, and the gradient coils extending in second and third directions parallel to the surface of the magnet consisting each of first and second sets of tracks, each set being composed of two subsets of substantially semicircular concentric tracks separated by a diametrical axis, the diametral axis of the gradient coils extending in said second direction being oriented perpendicular to the diametral axis of the gradient coils extending in said third direction, and said first sets being arranged in mutually overlapping relationship on the surface of said magnet and said second sets being arranged in mutually overlapping relationship on a wall opposed to the surface of the magnet of a support structure, such that said coils at least partially contain said imaging volume.

14. A device as claimed in claim 13, wherein said support structure comprises a receiving coil.

15. A device as claimed in claim 10, wherein the inhomogeneity correcting means includes means for generating a polynomial that represents the magnetic field generated by the magnet and comprises a plurality of harmonic terms, each associated with a coefficient, and said polynomial is a solution of the Laplace's equation with boundary conditions on a spherical cap, such that the magnetic field on one side of said magnet in a volume bounded by a spherical cap surface, in which volume and along which surface the magnetic field is homogeneous such that the magnetic field defines field lines having equal parallel directions and equal intensities.

16. A Nuclear Magnetic Resonance Imaging device, comprising a magnet for generating a static magnetic field, means for generating magnetic field gradients, means for emitting excitation pulses, means for receiving the magnetic resonance signals emitted by the target body and means for correcting inhomogeneity of said static magnetic field, which inhomogeneity correcting means include one or more correction elements for obtaining the desired field characteristics and processing means for calculating the position and magnitude parameters of said one or more correction elements,
wherein
said magnet has two pole pieces in spaced relationship on opposite sides of a patient receiving volume, means being provided for correcting the magnetic field in said receiving volume such that the magnetic field is corrected in an imaging volume bounded by a spherical cap surface, in which volume and along which surface the magnetic field is homogeneous such that the magnetic field has field lines having equal parallel directions and equal intensities.

17. A device as claimed in claim 16, wherein the inhomogeneity correcting means includes means for generating a polynomial that represents the magnetic field generated by the magnet and comprises a plurality of harmonic terms, each associated with a coefficient, and said polynomial is a solution of the Laplace's equation with boundary conditions on a spherical cap, such that the magnetic field on one side of said magnet in a volume bounded by a spherical cap surface, in which volume and along which surface the magnetic field is homogeneous such that the magnetic field defines field lines having equal parallel directions and equal intensities.

* * * * *